(12) United States Patent
Fourst et al.

(10) Patent No.: US 7,816,676 B2
(45) Date of Patent: Oct. 19, 2010

(54) HERMETICALLY SEALED PACKAGE AND METHODS OF MAKING THE SAME

(75) Inventors: Donald Franklin Fourst, Glenville, NY (US); William Francis Nealon, Gloversville, NY (US)

(73) Assignee: General Electric Company, Schenectady, NY (US)

( * ) Notice: Subject to any disclaimer, the term of this patent is extended or adjusted under 35 U.S.C. 154(b) by 237 days.

(21) Appl. No.: 12/062,364

(22) Filed: Apr. 3, 2008

(65) Prior Publication Data

US 2008/0185701 A1      Aug. 7, 2008

Related U.S. Application Data

(62) Division of application No. 11/150,401, filed on Jun. 10, 2005, now abandoned.

(51) Int. Cl.
H01L 51/00      (2006.01)
(52) U.S. Cl. ............. 257/40; 257/E21.5; 257/79; 257/100; 257/642; 438/82; 438/92
(58) Field of Classification Search ............. 257/E21.5, 257/E23.138, 40, 48, 79, 98, 100, 642, 678, 257/682, 787; 438/82, 92, 114; 313/504, 313/506, 512; 398/121, 124, 125, 128, 132
See application file for complete search history.

(56) References Cited

U.S. PATENT DOCUMENTS

| | | | |
|---|---|---|---|
| 5,874,804 A | 2/1999 | Rogers | |
| 6,160,346 A | 12/2000 | Vleggaar et al. | |
| 6,537,688 B2 * | 3/2003 | Silvernail et al. | ............ 428/690 |
| 6,576,351 B2 * | 6/2003 | Silvernail | ............ 428/690 |
| 6,592,969 B1 | 7/2003 | Burroughes et al. | |
| 6,635,989 B1 | 10/2003 | Nilsson et al. | |
| 6,706,316 B2 | 3/2004 | Ghosh et al. | |
| 6,724,143 B2 | 4/2004 | Chen et al. | |
| 6,737,753 B2 | 5/2004 | Kumar et al. | |
| 6,878,973 B2 * | 4/2005 | Lowery et al. | ............ 257/100 |
| 6,956,325 B2 * | 10/2005 | Yamazaki et al. | ............ 313/512 |
| 7,078,726 B2 | 7/2006 | Pichler et al. | |
| 7,129,636 B2 | 10/2006 | Chang | |
| 7,164,199 B2 | 1/2007 | Tarn | |
| 7,202,602 B2 | 4/2007 | Anandan | |
| 7,541,671 B2 * | 6/2009 | Foust et al. | ............ 257/688 |
| 7,649,674 B2 * | 1/2010 | Danner et al. | ............ 359/296 |
| 7,719,186 B2 * | 5/2010 | Valentine et al. | ............ 313/509 |
| 2002/0068191 A1 | 6/2002 | Kobayashi et al. | |
| 2002/0180371 A1 | 12/2002 | Yamazaki et al. | |
| 2004/0135268 A1 | 7/2004 | Frischnecht | |
| 2004/0195967 A1 * | 10/2004 | Padiyath et al. | ............ 313/512 |
| 2005/0139844 A1 | 6/2005 | Park et al. | |
| 2009/0302436 A1 * | 12/2009 | Kim et al. | ............ 257/659 |

FOREIGN PATENT DOCUMENTS

WO    WO 2004/092566 A    10/2004

* cited by examiner

Primary Examiner—Chris Chu
(74) Attorney, Agent, or Firm—Fletcher Yoder

(57) ABSTRACT

Hermetically sealed packages having organic electronic devices are presented. A number of sealing mechanisms are provided to hermetically seal the package to protect the organic electronic device from environmental elements. A metal alloy sealant layer is employed proximate to the organic electronic device. Alternatively, a metal alloy sealant layer in combination with primer layer may also be implemented. Further, superstrates and edge wraps may be provided to completely surround the organic electronic device.

14 Claims, 7 Drawing Sheets

HERMETICALLY SEALED PACKAGE AND METHODS OF MAKING THE SAME

CROSS REFERENCE TO RELATED APPLICATIONS

This application is a divisional of U.S. patent application Ser. No. 11/150,401, entitled "Hermetically Sealed Package and Methods of Making The Same", filed Jun. 10, 2005, which is herein incorporated by reference in its entirety.

STATEMENT REGARDING FEDERALLY SPONSORED RESEARCH & DEVELOPMENT

This invention was made with Government support under contract number 70NANB3H3030 awarded by National Institute of Standards and Technology. The Government has certain rights in the invention.

BACKGROUND

The invention relates generally to hermetically sealed electronic packages. More particularly, the invention relates to electronic packages employing organic devices and having a low temperature hermetic seal and methods of making the same.

Organic devices are low cost and high performance alternatives of the silicon semiconductor devices and are employed in various applications, such as, organic light emitting diodes (OLEDs), organic light sensors, organic transistors, organic solar cells, and organic lasers.

However, these organic devices may require protection from environmental elements such as, moisture or oxygen, to prevent degradation of the device. Most of these devices are made of a layered structure incorporating different layers of materials each having diverse functionalities. One common way to protect these devices includes providing encapsulation to the layered structure. Typically, the procedure to encapsulate the organic device includes sandwiching the organic device between a substrate and an encapsulation layer such that there is a continuous perimeter seal around the device. Often, sheets of glass, metal, or plastics having barrier coatings are used to sandwich the device. These sheets are joined together with adhesives, often based on epoxies. While the sheet materials provide excellent hermetic properties, the adhesives may not.

In the past, thinner layers of adhesives have been employed between the substrate and the encapsulation layer to limit the diffusion of undesirable elements such as, water and/or oxygen into the package. While the rate of diffusion is reduced by employing thinner layers of adhesives, the adhesive remains quite permeable to environmental elements. As will be appreciated, adhesives having fewer interfacial voids at the unions of the adhesive and the sheet materials lead to slower diffusion rates of the adhesive into the package during fabrication, thereby resulting in insufficient coverage of the encapsulant perimeter around the device. Additionally, moisture absorber or getters may be employed on the surface of the encapsulant or may be incorporated into the package to prevent any intruding water from entering the package. However, these materials are expensive and also have limited capacity in terms of preventing the permeation of environmental elements into the encapsulant.

Accordingly, there is a need for electronic packages employing sealing materials that reduce the permeation of environmental elements through the edges of the devices, as compared to conventional devices.

BRIEF DESCRIPTION

In accordance with an aspect of the present technique, a hermetically sealed package is provided. The package includes a first substrate and an organic electronic device disposed on an upper surface of the substrate. Further, the hermetically sealed package includes a superstrate disposed proximate to the organic electronic device. The superstrate comprises a peripheral portion adapted to wrap around edges of the package such that the peripheral portion of the superstrate is coupled to a lower surface of the substrate opposite the organic electronic device. Furthermore, the package includes a metal alloy sealant layer disposed on the lower surface of the substrate such that the peripheral portion of the superstrate is hermetically sealed to the lower surface of the substrate.

In accordance with another aspect of the present technique, a method of fabricating a hermetically sealed electronic package is provided. The method includes the steps of disposing a plurality of organic electronic devices on a substrate, providing a metal foil having approximately the same dimensions as the substrate. Further, the method also includes patterning the metal foil with a plurality of patterns comprising a metal alloy sealant, wherein each of the plurality of patterns is sized to completely surround the organic electronic devices upon coupling the metal foil with the substrate and coupling the metal foil to the substrate.

In accordance with another aspect of the present technique, a hermetically sealed package is provided. The package includes a first substrate, an organic electronic device disposed on an upper surface of the substrate and an insulating adhesive layer disposed above the organic electronic device. The organic electronic device may be an organic electroluminescent device or an organic photovoltaic device. Further, the hermetically sealed package includes a superstrate coupled to the insulating adhesive layer and disposed proximate to the organic electronic device. The superstrate comprises a peripheral portion adapted to wrap around edges of the package such that the peripheral portion of the superstrate is coupled to a lower surface of the substrate opposite the organic electronic device. Furthermore, the package includes a metal alloy sealant layer disposed on the lower surface of the substrate such that the peripheral portion of the superstrate is hermetically sealed to the lower surface of the substrate.

DRAWINGS

These and other features, aspects, and advantages of the present invention will become better understood when the following detailed description is read with reference to the accompanying drawings in which like characters represent like parts throughout the drawings, wherein.

DETAILED DESCRIPTION

Organic electronic devices have been encapsulated by a variety of techniques to circumvent the deleterious effects of environmental elements such as, moisture and oxygen. Currently, sheets of glass, metals, or plastics are used to sandwich the organic electronic devices. Typically, these sheets are coupled by use of adhesives, such as epoxy-based adhesives. While, the sheet materials provide superior hermetic properties, the adhesives are generally permeable to moisture and oxygen. It is therefore desirable to develop a material that may be employed to couple the sheets while providing hermeticity to the packages containing organic electronic devices.

Figure 1:
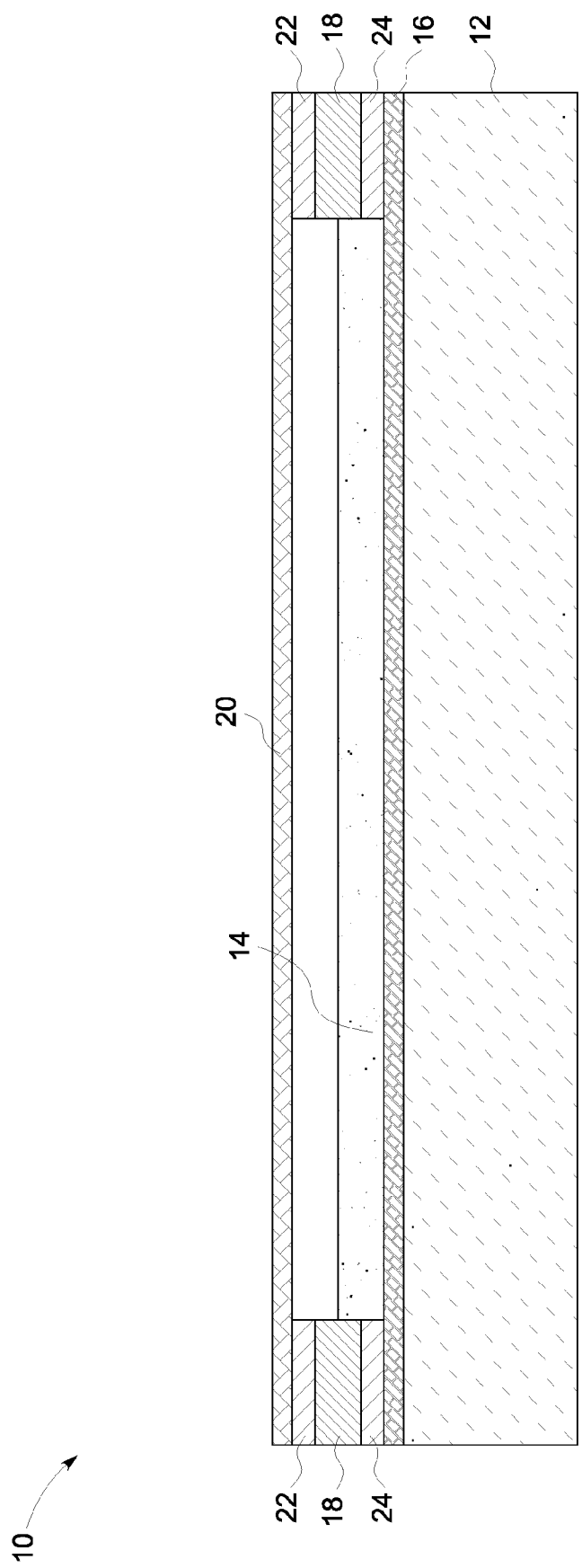
FIG. 1 is a cross sectional view of an exemplary hermetically sealed package employing a metal alloy sealant layer, according to one embodiment of the present technique.

Referring to FIG. 1, a cross-sectional side view of an exemplary embodiment of a hermetically sealed package 10 is illustrated. In the presently contemplated configuration, the hermetically sealed package 10 is illustrated diagrammatically as including a first substrate 12 configured to receive an organic electronic device 14. In some embodiments, the first substrate 12 may include a flexible substrate. As used herein, the term "flexible" generally means being capable of being bent into a shape having a radius of curvature of less than approximately 100 cm. In other embodiments, the first substrate 12 may include a composite structure. The first substrate 12 may comprise a single layer or a structure having a plurality of adjacent layers of different materials. In accordance with aspects of the present technique, the first substrate 12 may include materials, such as, but not limited to, plastic, metal foil, or glass. The first substrate 12 is generally thin, having a thickness in a range from about 0.25 mils to about 50.0 mils, and preferably in a range from about 0.5 mils to about 10.0 mils. In accordance with aspects of the present technique, the first substrate 12 may also comprise a substantially transparent film. As used herein, "substantially transparent" refers to a material allowing a total transmission of at least about 50%, preferably at least about 80%, of visible light (i.e., having a wave length in a range from about 400 nm to about 700 nm).

In certain embodiments, the first substrate 12 may include a flexible substrate that is compatible with roll-to-roll processing. Advantageously, implementing a roll of film for the flexible substrate enables the use of high-volume, low cost, reel-to-reel processing and fabrication of the hermetically sealed package 10. The roll of film may have a width of 1 foot, for example, on which a number of components (e.g., organic electronic devices) may be fabricated. By using rollable substrates, manufacturability of the device may be improved.

Moreover, the first substrate 12 may have an index of refraction varying in a range from about 1 to about 2.5, and preferably in a range from about 1 to about 2. The first substrate 12 generally may comprise any flexibly suitable polymeric material. Additionally, the first substrate 12 may comprise polycarbonates, polyarylates, polyetherimides, polyethersulfones, polyimides, such as Kapton H or Kapton E (made by Dupont) or Upilex (made by UBE Industries, Ltd.), polynorbornenes, such as cyclic-olefins (COC), liquid crystal polymers (LCP), such as polyetheretherketone (PEEK), polyethylene terephthalate (PET), and polyethylene naphtalate (PEN).

In addition, the hermetically sealed package 10 may include an organic electronic device 14 disposed on the first substrate 12. In certain embodiments, the organic electronic device 14 may include one of an electroluminescent device (such as an organic light emitting device (OLED), an organic photovoltaic cell, an organic photo-detector, an organic electrochromic device, an organic sensor, or combinations thereof. In these embodiments, the organic electronic device 14 may include a number of organic semiconductor layers disposed between two conductors or electrodes. Although not illustrated in FIG. 1, the electrodes of the organic electronic device 14 are electrically coupled to an external current source, which is used to initiate the light producing reactions in the organic electronic device 14. In accordance with aspects of the present technique, the organic electronic device 14 may be fabricated onto the first substrate 12 using a roll-to-roll process.

In certain embodiments, a barrier coating 16 may be disposed between the first substrate 12 and the organic electronic device 14 to prevent moisture and oxygen diffusion through the first substrate 12. In certain embodiments, the barrier coating 16 may be disposed or otherwise formed on the surface of the first substrate 12 such that the barrier coating 16 completely covers the first substrate 12. As will be appreciated by one of ordinary skill in the art, the barrier coating 16 may include any suitable reaction or recombination products for reacting species. In certain embodiments, the barrier coating 16 may have a thickness ranging from about 10 nm to about 10,000 nm, and preferably in a range from about 10 nm to about 1,000 nm. As will be appreciated, it is desirable to choose the thickness of the barrier coating 16 that does not impede the transmission of light through the first substrate 12, such as a barrier coating 16 that causes a reduction in light transmission of less than about 20%, and preferably less than about 5%. It is also desirable to choose a barrier coating material and thickness that does not significantly reduce the flexibility of the first substrate 12, and whose properties do not significantly degrade with bending.

In certain embodiments, the barrier coating 16 may be disposed by any suitable deposition techniques, such as physical vapor deposition, plasma-enhanced chemical-vapor deposition (PECVD), radio-frequency plasma-enhanced chemical-vapor deposition (RFPECVD), expanding thermal-plasma chemical-vapor deposition (ETPCVD), reactive sputtering, electron-cyclodrawn-residence plasma-enhanced chemical-vapor deposition (ECRPECVD), inductively coupled plasma-enhanced chemical-vapor deposition (ICPECVD), sputter deposition, evaporation, atomic layer deposition (ALD), or combinations thereof.

In certain embodiments, the barrier coating 16 may include materials such as, but not limited to, organic material, inorganic material, ceramics, metals, or combinations thereof. Typically, these materials are reaction or recombination products of reacting plasma species and are deposited onto the surface of the first substrate 12. In certain embodiments, the organic materials may comprise carbon, hydrogen, oxygen and optionally, other minor elements, such as sulfur, nitrogen, silicon, etc., depending on the types of reactants. Suitable reactants that result in organic compositions in the coating are straight or branched alkanes, alkenes, alkynes, alcohols, aldehydes, ethers, alkylene oxides, aromatics, etc., having up to 15 carbon atoms. Inorganic and ceramic coating materials typically comprise oxide, nitride, carbide, boride, oxynitride, oxycarbide, or combinations thereof of elements of Groups IIA, IIIA, IVA, VA, VIA, VIIA, IB, and IIB; metals of Groups IIIB, IVB, and VB, and rare-earth metals. For example, silicon carbide can be deposited onto a substrate by recombination of plasmas generated from silane (SiH4) and an organic material, such as methane or xylene. Silicon oxycarbide can be deposited from plasmas generated from silane, methane, and oxygen or silane and propylene oxide. Silicon oxycarbide also can be deposited from plasmas generated from organosilicone precursors, such as tetraethoxysilane (TEOS), hexamethyldisiloxane (HMDSO), hexamethyldisilazane (HMDSN), or octamethylcyclotetrasiloxane (D4). Silicon nitride can be deposited from plasmas generated from silane and ammonia. Aluminum oxycarbonitride can be deposited from a plasma generated from a mixture of aluminum titrate and ammonia. Other combinations of reactants, such as metal oxides, metal nitrides, metal oxynitrides, silicon oxide, silicon nitride, silicon oxynitrides may be chosen to obtain a desired coating composition.

In other embodiments, the barrier coating 16 may comprise hybrid organic/inorganic materials or multilayer organic/inorganic materials. The organic materials may comprise acrylates, epoxies, epoxyamines, xylenes, siloxanes, silicones, etc. The choice of the particular reactants can be appreciated by those skilled in the art. Most metals may also be suitable for the barrier coating 16 in applications where transparency of the first substrate 12 is not required. As will be appreciated, the first substrate 12 may comprise a composition, which incorporates the first barrier layer 16 to provide a hermetic substrate.

Further, as mentioned above, the hermetically sealed package 10 includes a second substrate 20 which may be coupled to the first substrate 12 by the metal alloy sealant layer 18. In some embodiments, the second substrate 20 may be disposed such that the peripheral portion of the second substrate 20 is patterned to wrap around the edges of the package 10. In these embodiments, the peripheral portion of the second substrate 20 may be coupled to a side of the first substrate 12 opposite the barrier coating 16. In other words, the peripheral portion of the second substrate 20 may be configured to be coupled to the side of the first substrate 12 opposite the barrier coating 16 thereby hermetically sealing the package 10. In these embodiments, the second substrate may also be referred to as "superstrate". These exemplary embodiments will be illustrated and described further with reference to FIGS. 3-6. In an alternate embodiment, an edge encapsulating material configured to hermetically seal the peripheral edges of hermetically sealed package may be disposed along the perimeter of the organic electronic device 14 between the first and second substrates 12 and 20. These exemplary embodiments will be illustrated and described with reference to FIGS. 7-10.

In accordance with aspects of the present technique, the second substrate 20 may comprise a thin material having a low permeability. In accordance with aspects of the present technique, the second substrate may or may not be transparent, depending on the application. In certain embodiments, the second substrate 20 may include a reflective material, such as a metal foil, to reflect light produced by the organic electronic device 14. In certain embodiments, the second substrate 20 may include aluminum foil, stainless steel foil, copper foil, tin, Kovar, Invar, etc. In applications where reflective light is less critical, the second substrate 20 may comprise thin glass, sapphire, mica or barrier coated plastics having a low permeability. Generally, the second substrate 20 is applied to reflect any radiation emitted away from the first substrate 12 and direct such radiation towards the first substrate 12 such that the total amount of radiation emitted in this direction is increased. Advantageously, the second substrate 20 may include a material to prevent diffusion of reactive of reactive environmental elements, such as oxygen and moisture, into the organic electronic device 14. The second substrate 20 is sufficiently thin so as not to reduce the flexibility of the entire device. Further, as described below with reference to FIGS. 11 and 12, the second substrate may include a number of layers of various metals or metal compound to further reduce the diffusion of oxygen and water vapor into the organic electronic device 14. In one embodiment, the inner side of the second substrate 20, directly adjacent to the organic electronic device 14, is reflective while the outer layers comprise non-reflective materials or compounds such as metal oxides, nitrides, carbides, oxynitrides, or oxycarbides which may be implemented to reduce the rate if diffusion of oxygen and water into the organic electronic device 14.

In accordance with aspects of the present technique, to provide hermeticity, a metal alloy sealant layer 18 is disposed proximate to the organic electronic device 14. Hereinafter, the metal alloy sealant layer will be interchangeably referred to as metal alloy sealant. In the illustrated embodiment of FIG. 1, the metal alloy sealant 18 is disposed about the entire perimeter of the organic electronic device 14 such that the organic electronic device 14 is completely surrounded by the metal alloy sealant 18. Generally, the metal alloy sealant 18 comprises an adhesive material such that it may be employed to couple the first substrate 12 or the barrier coating 16 to the second substrate 20, thereby completely enclosing the organic electronic device 14. The metal alloy sealant layer 18 may generally include any material having low permeability and providing adhesion. Techniques for disposing the metal alloy sealant layer 18 will be described further herein with reference to FIG. 2. As described in detail below, in certain embodiments, the metal alloy sealant 18 may be directly coupled to the first or second substrates of the hermetically sealed package 10. Whereas, in other embodiments, one or more primer layers such as a first primer layer 22 and/or a second primer layer 24 or both may be disposed between the metal alloy sealant layers 18 and the first and/or second substrates 12 and 20. As described further below, the primer layers 22 and 24 may be utilized to facilitate adhesion between the meal alloy sealant 18 and the substrates 12 and 20.

In certain embodiments, the metal alloy sealant 18 may be applied to the package 10 by heating the package 10 above the melting point of the metal alloy sealant. Upon heating, the metal alloy sealant 18 melts and flows, thereby forming a continuous layer, which upon solidification forms a seal which is impervious to water and oxygen. Accordingly, it is desirable to employ a metal alloy sealant 18 having a melting point of less than about 150° C. so that it does not alter the properties of the layers of the organic electronic device 14 while heating the metal alloy to form a melt. Simultaneously, it is also desirable to have the melting point of the metal alloy sealant greater than the operating temperature of the organic electronic device, so that the seal does not lose its hermeticity during operational conditions of the organic electronic device 14. Accordingly, in certain embodiments, the metal alloy sealant material may include alloys of bismuth, tin, lead, indium, cadmium, or combinations thereof.

In certain embodiments, the metal alloy sealant 18 may include metal alloy having a volume percent of bismuth ranging from about 0 to about 50%, or a volume percent of tin ranging from about 5% to about 50%, or a volume percent of lead ranging from about 0 to about 50%, or a volume percent of indium ranging from about 0 to about 55%, or a volume percent of cadmium ranges from about 0 to about 15%. In an exemplary embodiment, the metal alloy sealant may include a volume percent of bismuth ranging from about 42% to about 46%, a volume percent of tin ranging from about 6% to about 10%, a volume percent of lead ranging from about 20% to about 24%, a volume percent of indium ranging from about 17% to about 21%, and a volume percent of cadmium ranging from about 3% to about 7%. In another exemplary embodiment, the metal alloy sealant 18 may include a volume percent of bismuth ranging from about 47% to about 51%, a volume percent of tin ranging from about 10% to about 12%, a volume percent of lead ranging from about 16% to about 20%, and a volume percent of indium ranging from about 19% to about 23%. In yet another exemplary embodiment, the metal alloy sealant 18 may include a volume percent of bismuth ranging from about 48% to about 52%, a volume percent of tin ranging from about 10% to about 12%, a volume percent of lead ranging from about 23% to about 27%, and a volume percent of cadmium ranging from about 10% to about 14%. In another exemplary embodiment, the metal alloy sealant 18 may include a volume percent of bismuth ranging from about 53% to about 57% and a volume percent of tin ranging from about 40% to about 44%. In another exemplary embodiment, the metal alloy sealant 18 may include a volume percent of tin ranging from about 46% to about 50% and a volume percent of indium ranging from about 50% to about 54%.

Additionally, in some embodiments, a primer layer such as a first primer layer 22 and a second primer layer 24 may be disposed on either side of the metal alloy sealant layer 18 as illustrated in FIG. 1. As will be appreciated by those skilled in the art, the primer layers wet the surface of the first substrate 12 (or barrier coating 16) and/or the second substrate 20 and thereby, facilitate adhesion between the metal alloy sealant layer 18 and the first and/or second substrates 12 and 20. In an exemplary embodiment, the first or second primer layer 22 and 24 or both may include tin. Further, in some embodiments, the primer layers 22 and 24 may be electrodeposited on the surfaces of the first and/or second substrates 12 and 20. In other embodiments, the primer layer may be deposited using deposition techniques, such as, but not limited to, evaporation and sputtering. In some embodiments, the primer layers 22 and 24 may have a thickness varying in a range from about 10 nm to about 10,000 nm.

Figure 2:
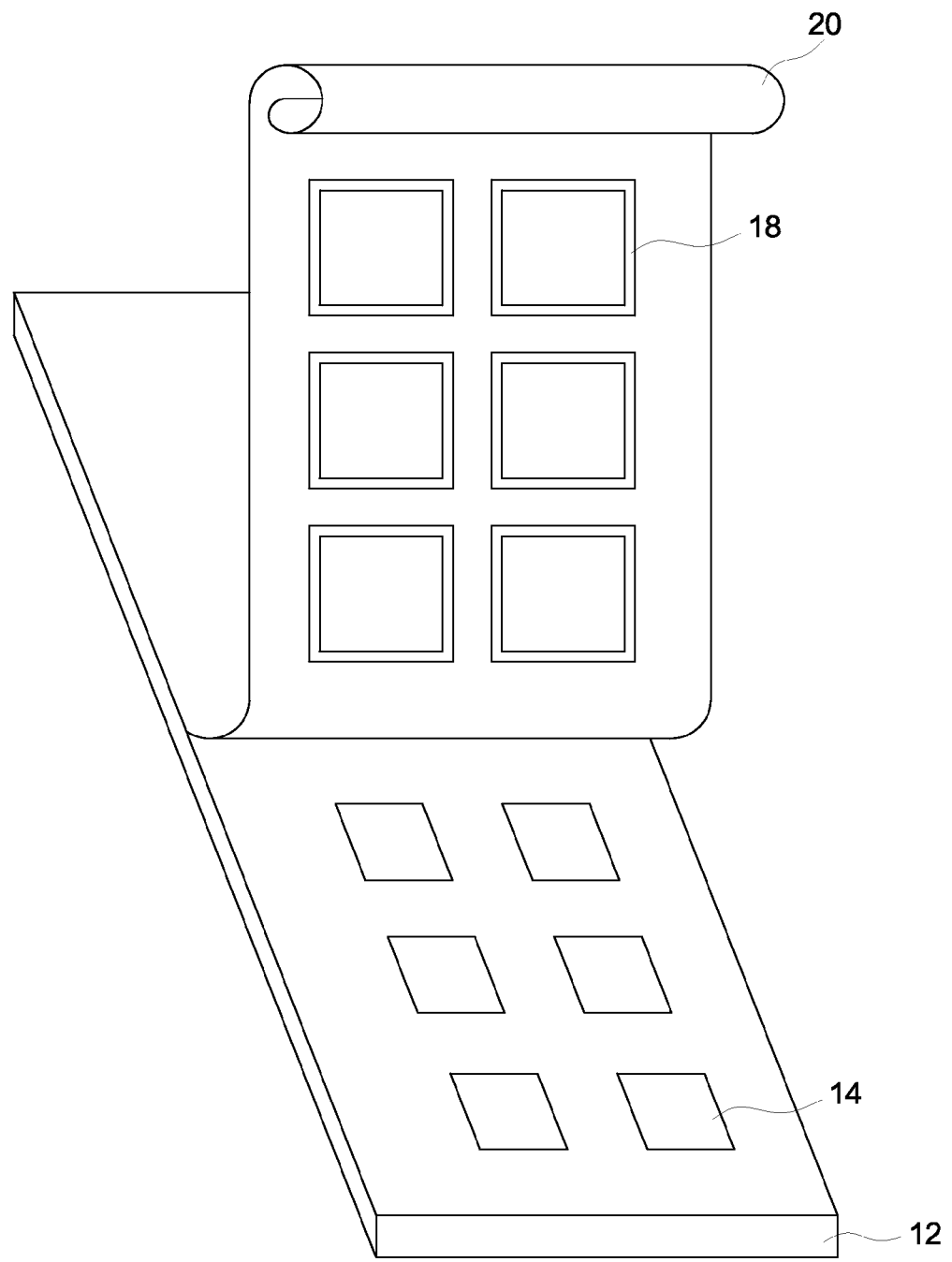
FIG. 2 is a perspective view of one method of fabricating a hermetically sealed package for an organic electronic device, according to one embodiment of the present technique.

FIG. 2 illustrates an exemplary process for fabricating a number of hermetically sealed packages, such as the package 10 discussed with reference to FIG. 1. As will be appreciated, the first substrate 12 may be fed from a polymer film roll. In an exemplary embodiment, the roll may be sized such that the two packages 10 can be fabricated adjacent to one another, as illustrated in FIG. 2. The first substrate 12 is coated with the barrier coating 16 and organic electronic devices 14 are arranged thereon. In some embodiments, the second substrate 20 may also be fed from a roll. In the illustrated embodiment, the metal alloy sealant 18 is disposed onto the surface of the second substrate 20 to form the seal around the entire peripheral portion of the organic electronic device 14, once the second substrate 20 is coupled to the first substrate 12. In certain embodiments, the metal alloy sealant 18 may be screen-printed, inkjet printed, laminated or disposed onto the surface of the second substrate 20 by any other suitable means. Once roll-to-roll manufacturing is completed, the hermetically sealed package 10 may be excised from the rolls. As will be appreciated, other fabrication techniques may be implemented to construct the hermetically sealed packages 10.

Figure 3:
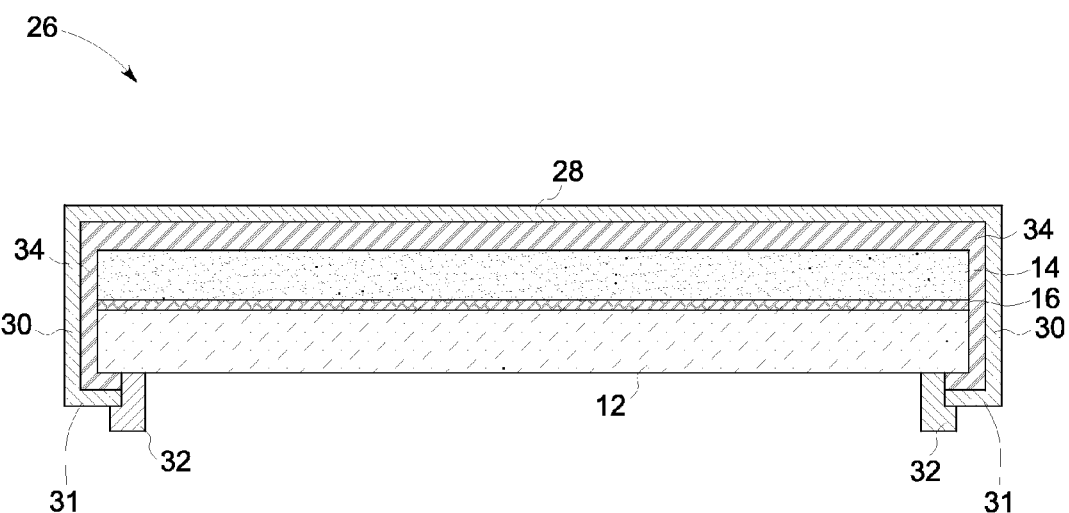
FIG. 3 is a cross sectional view of an exemplary hermetically sealed package employing a superstrate, according to another embodiment of the present technique.

Referring to FIG. 3, a cross sectional side view 26 of an alternate embodiment of the hermetically sealed package illustrated in FIG. 1 is shown. As with the embodiment illustrated in FIG. 1, the hermetically sealed package 26 includes a first substrate 12, a barrier coating 16, and an organic electronic device 14. Further, in the illustrated embodiment, the hermetically sealed package 26 also includes a second substrate 28. As described above, in the illustrated embodiment, the second substrate comprises a superstrate 28. In the illustrated embodiment, the superstrate 28 includes edges 30 which are sized such that they can be wrapped around the edges of the first substrate 12 and coupled to the outer side of the first substrate 12 (i.e., the side of the first substrate 12 that is opposite to the side having the barrier coating 16) to form a peripheral portion 31. In the illustrated embodiment, the edges 30 of the superstrate 28 are adhesively coupled to the outer side of the first substrate 12 using a metal alloy sealant 32. The metal alloy sealant 32 may comprise the same material as the metal alloy sealant 18. As will be appreciated, to effectively protect the organic electronic device 14 from moisture and oxygen, the metal alloy sealant 32 advantageously comprises a material having a low permeability. Further, the hermetically sealed package 26 may include an insulating adhesive 34 disposed between the organic electronic device 14 and the second substrate 28 to insulate the device 14 from the second substrate 28. As illustrated in FIG. 3, the metal alloy sealant 32 is employed to seal the peripheral portion of the insulating adhesive 34, as well.

Figure 4:
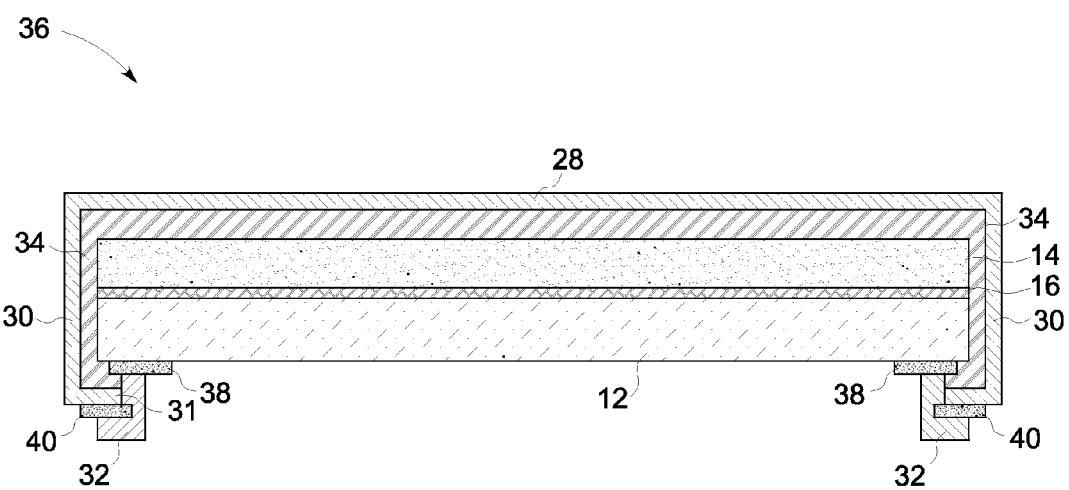
FIG. 4 is a cross sectional view of an alternate embodiment of the hermetically sealed package of FIG. 3 employing a primer.

FIG. 4 illustrates another alternate embodiment of a hermetically sealed package 36 employing a superstrate 28 and primer layers 38 and 40. As with the illustrated embodiments, in FIGS. 1 and 3, the hermetically sealed package 36 includes a first substrate 12, a barrier coating 16, and an organic electronic device 14. In the illustrated embodiment, the edges 30 of the superstrate 28 are adhesively coupled to the outer side of the first substrate 12 using a metal alloy sealant 32. Further, an insulating adhesive 34 is disposed between the organic electronic device 14 and the superstrate 28. In certain embodiments, one or more primer layers may be employed in the hermetically sealed package 36 to enhance adhesion of the metal alloy sealant 32 to the peripheral portion 31 of the superstrate 28 and/or the outer side of the first substrate 12. In the presently contemplated embodiment, the primer layer 38 may be disposed between the metal alloy sealant 32 and the outer side of the first substrate 12 and the primer layer 40 may be disposed between the metal alloy sealant 32 and the peripheral portion 31 of the first substrate 12. As will be appreciated, the primer layers 32 and 40 may vary in material composition. In certain embodiments, the primer layers 38 and 40 may include tin.

Figure 5:
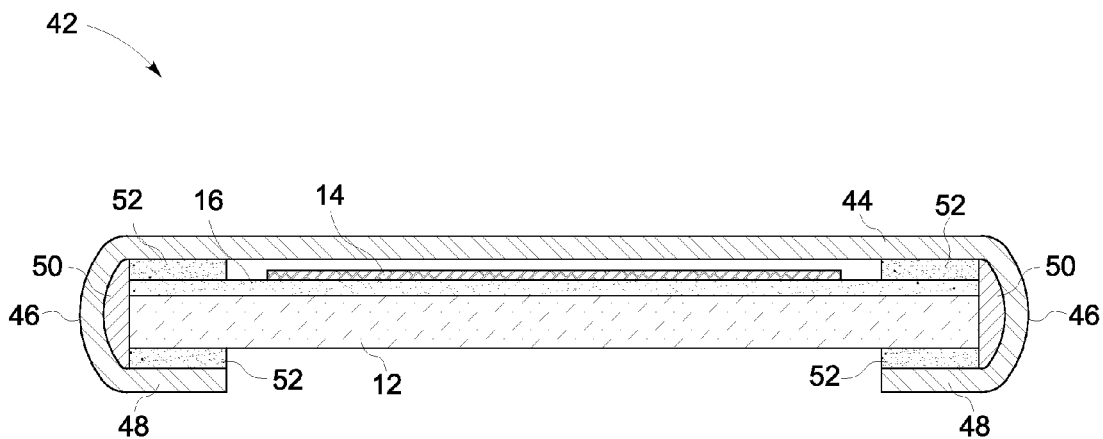
FIG. 5 is a cross sectional view of an exemplary hermetically sealed package employing a superstrate, according to another embodiment of the present technique.

FIG. 5 illustrates another exemplary embodiment of the hermetically sealed package 42 employing a superstrate 44. As with the illustrated embodiments, in FIGS. 1, 3 and 4, the hermetically sealed package 42 includes a first substrate 12, a barrier coating 16, and an organic electronic device 14. In the illustrated embodiment, the package 42 includes a superstrate 44 having edges 46 and peripheral portions 48. In certain embodiments, to further provide hermeticity a desiccant or a getter material may be employed in the hermetically sealed package 42 having a superstrate 44 as the second substrate. In these embodiments, the desiccant or getter material may be disposed within the pockets formed by wrapping the edges of the superstrate 44. As will be appreciated, the desiccant comprises a material having a high affinity for water or oxygen and is implemented as a drying agent. Advantageously, the desiccant or getter 50 absorbs moisture or oxygen thereby further protecting the organic electronic device 14. In certain embodiments, the desiccant or getter 50 may comprise calcium oxide, silica gel, Hisil, Zeolite, calcium sulfate (DRIERITE), barium oxide, or other reactive metals for instance. As will be appreciated, the desiccant or getter 50 may be omitted.

In the presently contemplated embodiment, the superstrate 44 is coupled to the first substrate 12 by employing a metal alloy sealant layer 52 about the perimeter of the organic electronic device 14. Additionally, the peripheral portion 48 of the superstrate 44 is coupled to the outer side of the first substrate 12 using a metal alloy sealant layer 52. The metal alloy sealant 52 may comprise the same material as the metal alloy sealant 18.

Figure 6:
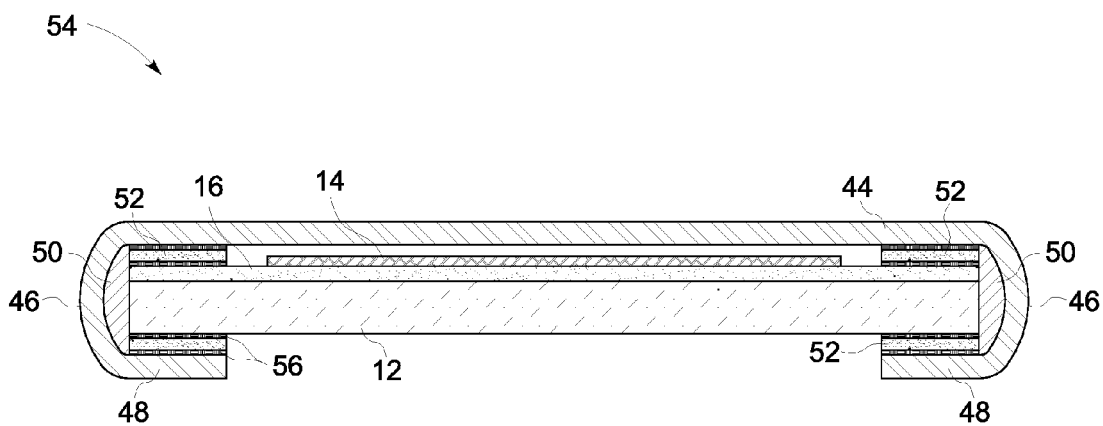
FIG. 6 is a cross sectional view of an alternate embodiment of the hermetically sealed package of FIG. 5 employing a primer.

FIG. 6 illustrates another exemplary embodiment of a hermetically sealed package 54 employing a superstrate. As with the illustrated embodiments, in FIGS. 1, 3, 4 and 5 the hermetically sealed package 54 includes a first substrate 12, a barrier coating 16, and an organic electronic device 14. In the illustrated embodiment, the package 54 includes a superstrate 44 having edges 46 and peripheral portions 48. In certain embodiments, to further provide hermeticity a desiccant or a getter material may be employed in the hermetically sealed package 54. As with FIG. 5, in these embodiments, the desiccant or getter material 50 may be disposed within the pockets formed by wrapping the edges 46 of the superstrate 44. In the presently contemplated embodiment, the superstrate 44 is coupled to the first substrate 12 by employing a metal alloy sealant layer 52 about the perimeter of the organic electronic device 14. Additionally, the peripheral portions 48 of the superstrate 44 are coupled to the outer side of the first substrate 12 using a metal alloy sealant layer 52. Further, in the illustrated embodiment, one or more primer layers, such as primer layers 56 may be employed adjacent to the metal alloy sealant layer 52 and the second surface. The metal alloy sealant 52 may comprise the same material as the metal alloy sealant 18.

Figure 7:
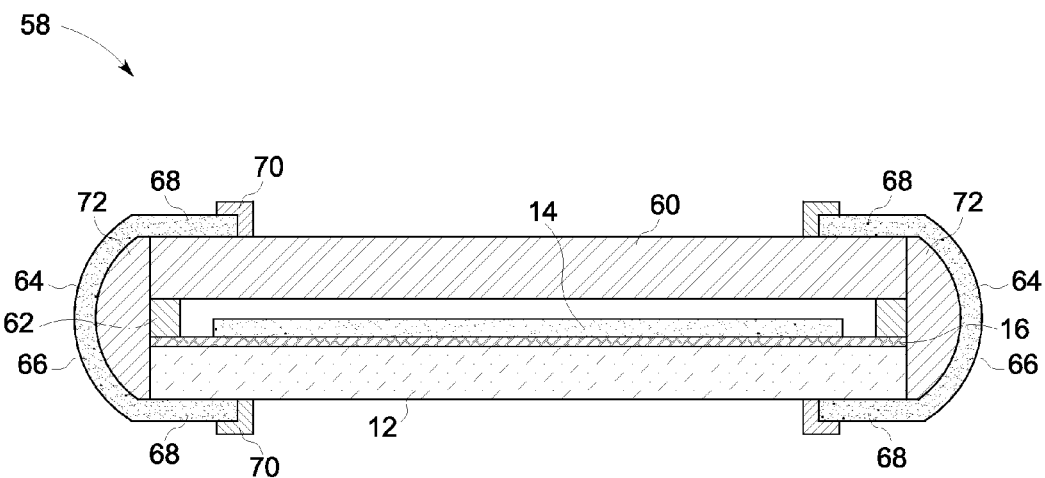
FIG. 7 is a cross sectional view of an exemplary hermetically sealed package employing an edge wrap, according to one embodiment of the present technique.

Referring now to FIG. 7, a cross sectional view of another hermetically sealed package 58 is illustrated. As with the embodiments illustrated in FIGS. 1, and 3-6, the hermetically sealed package 58 includes a first substrate 12, a barrier coating 16, and an organic electronic device 14. Additionally, the package 58 includes a second substrate 60. In the presently contemplated embodiment, the second substrate 60 may be a reflective substrate like superstrate 28 or may be a flexible substrate like the first substrate 12. Although not illustrated, a barrier coating, such as a barrier coating 16 may be disposed on the surface of the second substrate 60, which is closer to the organic electronic device 14. Additionally, an adhesive 62 may be disposed between the first and second substrates 12 and 60 and close to the edges of the two substrates to couple the two substrates together.

Next, the edges of the structure so formed may be sealed by implementing edge wraps 64 to provide improved hermeticity to the package 58. In the illustrated embodiment, edge wraps 64 includes side portions 66 and peripheral portions 68. Further, the edge wraps 64 are coupled to the substrates 12 and 60 via a metal alloy sealant 70, as illustrated in FIG. 7. In the illustrated embodiment, the metal alloy sealant 70 is disposed on the first and second substrates 12 and 60 close to the peripheral portions 68 of the edge wraps 64 such that the metal alloy sealant 70 hermetically seals the package 58. In certain embodiments, the edge wraps 64 may include aluminum foil, stainless steel foil, copper foil, tin, Kovar, Invar, etc. and may be insulative or conductive. Advantageously, the edge wraps 64 may provide a more robust hermetically sealed package since cracks in the hermetic coating of the second substrate, for example superstrate, are eliminated. As with the exemplary embodiments described with reference to FIGS. 5 and 6, a desiccant or getter material 72 may be disposed within the pockets created by wrapping the edge wraps 64 around the edges of the package 58.

Figure 8:
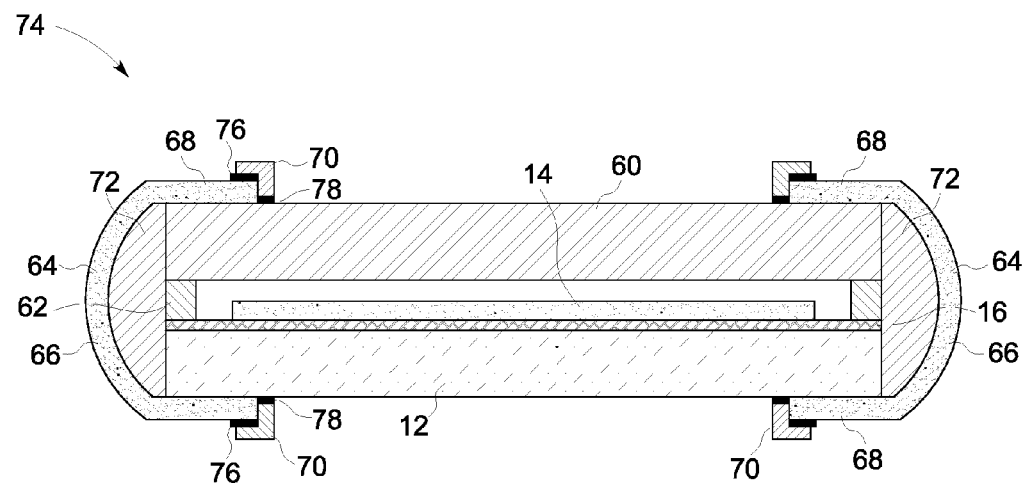
FIG. 8 is a cross sectional view of an alternate embodiment of the edge wrap of FIG. 7 employing a primer.

FIG. 8 illustrates an alternate embodiment of the hermetically sealed package of FIG. 7. In the illustrated embodiment, the hermetically sealed package 74 includes a first substrate 12, a barrier coating 16, a second substrate 60 and an organic electronic device 14. In the presently contemplated embodiment, the hermetically sealed package 74 includes a metal alloy sealant 70 as discussed with reference to FIG. 7. Additionally, to enhance the adhesion of the metal alloy sealant and thereby, improve the hermeticity of the package 74, one or more primer layers, such as primer layers 76 and 78 may be disposed between the metal alloy sealant 70 and the surfaces on which the metal alloy sealant 70 is disposed. For example, a primer layer 76 may be disposed between the metal alloy sealant 70 and the peripheral portion 68 of the edge wraps 64. Further, a primer layer 78 may be disposed between the metal alloy sealant 70 and the side portions of the first substrate 12 or the second substrate 60 or both. As will be appreciated, the material composition of the primer layers 76 and 78 may be same or different.

Figure 9:
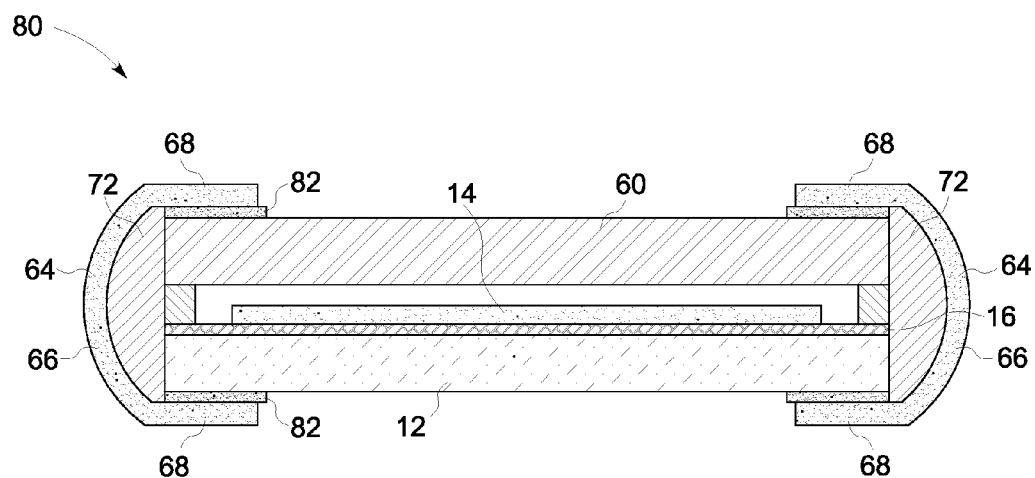
FIG. 9 is a cross sectional view of an exemplary hermetically sealed package employing an edge wrap, according to another embodiment of the present technique.

As with FIGS. 7 and 8, FIG. 9 illustrates another exemplary embodiment of a hermetically sealed package 80 employing edge wraps 64 according to aspects of the present technique. In the illustrated embodiment, the hermetically sealed package 80 includes a first substrate 12, a barrier coating 16, a second substrate 60 and an organic electronic device 14. In the presently contemplated embodiment, the hermetically sealed package 80 includes a metal alloy sealant, which is in the form of a layer 82 and is disposed between the peripheral portions 68 of the edge wrap 64 and about the perimeter of the first and second substrates 12 and 60. The metal alloy sealant layer 82 includes the same composition as metal alloy sealant 18 of FIG. 1.

Figure 10:
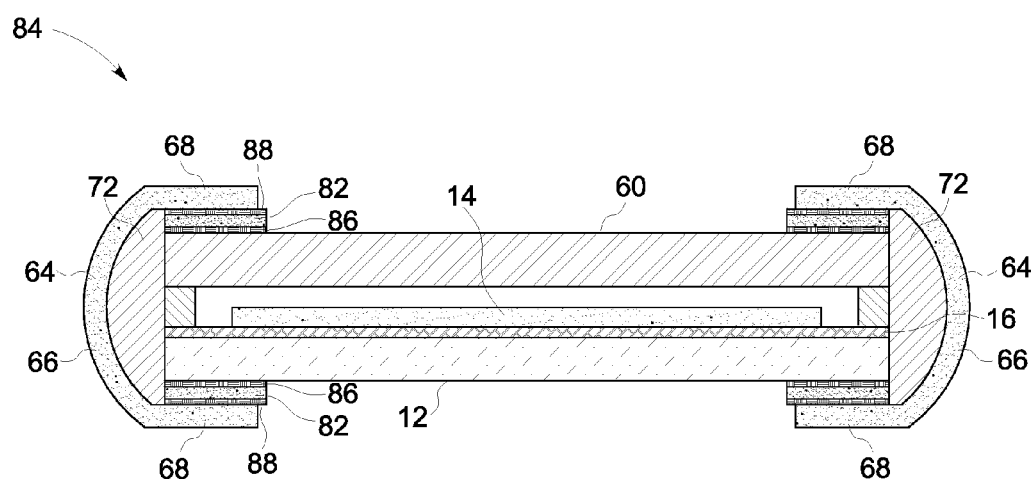
FIG. 10 is a cross sectional view of another alternate embodiment of the edge wrap of FIG. 9 employing a primer.

FIG. 10 illustrates an alternate exemplary embodiment of FIG. 9. In the illustrated embodiment, the hermetically sealed package 84 includes the metal alloy sealant layer 82, which has one or more primer layers, such as primer layers 86 and 88 disposed on either side of the metal alloy sealant layer 82 such that the primer layer is disposed between the metal alloy sealant layer 82 and the second surface. In the illustrated embodiment, the second surface refers to the surface of the first or second substrates 12 or 60. As discussed above, with reference to FIG. 1, application of primer facilitates adhesion of the metal alloy sealant layer with the other surface. In the illustrated embodiment, the primer layer 86 is disposed between the metal alloy sealant 82 and the first or second substrates 12 and 60. Similarly, the primer layer 88 is disposed between the metal alloy sealant and the peripheral portions 68 of the edge wraps 64.

FIGS. 1-10 provide a description of a first substrate 12 having an organic electronic device fabricated thereon and configured to provide improved hermeticity. As described further below, the first substrate 12 may comprise a composite structure.

Figure 11:
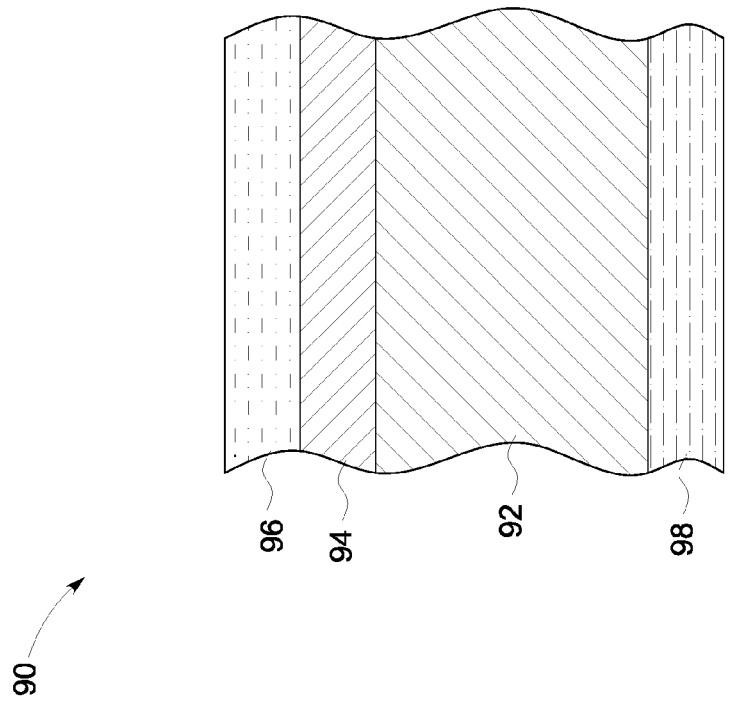
FIG. 11 is a cross sectional view of an exemplary composite substrate that may be implemented in conjunction with the present techniques.

FIG. 11 illustrates a flexible composite substrate 90 having a composite structure. In the illustrated embodiments, the flexible composite substrate 90 includes a substantially transparent flexible film 92. In one embodiment, the transparent flexible film may have a thickness varying in a range from about 0.25 mils to about 50.0 mils. In another embodiment, the transparent flexible film 92 may have a thickness varying in a range from about 0.5 mils to about 10.0 mils. In certain embodiments, the transparent flexible film 92 may have an index of refraction ranging from about 1.05 to about 2.5. In some embodiments, the transparent flexible film 92 may have an index of refraction ranging from about 1.1 to about 1.6. Further, the transparent flexible film 92 generally comprises any flexibly suitable polymer material. For example, the film 92 may comprise polycarbonates, polyarylates, polyetherimides, polyethersulfones, polyimides, such as Kapton H or Kapton E (made by Dupont) or Upilex (made by UBE Industries, Ltd.), polynorbornenes, such as cyclic-olefins (COC), liquid crystal polymers (LCP), such as polyetheretherketone (PEEK), polyethylene terephthalate (PET), and polyethylene naphtalate (PEN).

To provide hermeticity, the film 92 is coated with a transparent barrier coating 94 to prevent moisture and oxygen diffusion through the film 92 and to an organic electronic device (not shown). As with barrier coating 16, the barrier coating 94 may be disposed or otherwise formed on the surface of the film 92. In certain embodiments, the barrier coating 94 may be disposed at a thickness ranging from about 10 nm to about 10,000 nm, and preferably from about 10 nm to about 1,000 nm. It is generally desirable to choose a coating thickness that does not impede the transmission of light through the film 92, such as a barrier coating 94 that causes a reduction in light transmission of less than about 20%, and preferably less than about 5%. The coating may be disposed by any suitable deposition techniques, such as plasma-enhanced chemical-vapor deposition (PECVD), for example.

As described in FIG. 1 with reference to the barrier coating 16, the barrier coating 94 may comprise organic, inorganic or ceramic materials, for instance. The materials are reaction or recombination products of reacting plasma species and are deposited onto the surface of the film 92. Organic coating materials may comprise carbon, hydrogen, oxygen and optionally, other minor elements, such as sulfur, nitrogen, silicon, etc., depending on the types of reactants. Suitable reactants that result inorganic compositions in the coating are straight or branched alkanes, alkenes, alkynes, alcohols, aldehydes, ethers, alkylene oxides, aromatics, etc., having up to 15 carbon atoms. Inorganic and ceramic coating materials typically comprise oxide, nitride, carbide, boride, or combinations thereof of elements of Groups IIA, IIIA, IVA, VA, VIA, VIIA, IB, and IIB; metals of Groups IIIB, IVB, and VB, and rare-earth metals. For example, silicon carbide can be deposited onto a substrate by recombination of plasmas generated from silane (SiH4) and an organic material, such as methane or xylene. Silicon oxycarbide can be deposited from plasmas generated from silane, methane, and oxygen or silane and propylene oxide. Silicon oxycarbide also can be deposited from plasmas generated from organosilicone precursors, such as tetraethoxysilane (TEOS), hexamethyldisiloxane (HMDSO), hexamethyldisilazane (HMDSN), or octamethylcyclotetrasiloxane (D4). Silicon nitride can be deposited from plasmas generated from silane and ammonia. Aluminum oxycarbonitride can be deposited from a plasma generated from a mixture of aluminum tartarate and ammonia. Other combinations of reactants, such as metal oxides, metal nitrides, metal oxynitrides, silicon oxide, silicon nitride, silicon oxynitrides may be chosen to obtain a desired coating composition.

Further, the barrier coating 94 may comprise hybrid organic/inorganic materials or multilayer organic/inorganic materials. The inorganic materials may be chosen from A-F elements and the organic materials may comprise acrylates, epoxies, epoxyamines, xylenes, siloxanes, silicones, etc. The choice of the particular reactants can be appreciated by those skilled in the art.

The substrate 90 may also comprise a coating or protective layer 96 that is chemically resistant and has a low coefficient of thermal expansion ("CTE"). The protective layer 96 may be implemented to advantageously prevent the underlying materials from being chemically attacked by chemicals commonly used during fabrication of the substrate 90 or the organic package. Further, because of the low CTE, the protective layer 96 also allows processing of the substrate 90 at high temperatures. The protective layer 96 may comprise acrylates, epoxies, epoxyamines, xylenes, siloxanes, silicones, etc. potentially filled with inorganic fillers such a silica particles, for instance and may be deposited by a roll coating, slot coating, bar coating, spincoating, and other known wet chemical coating techniques. Alternatively the protective layer 96 may comprise inorganic and ceramic coating materials which typically comprise oxide, nitride, carbide, boride, or combinations thereof of elements from Groups IIA, IIIA, IVA, VA, VIA, VIIA, IB, and IIB, or metals from Groups IIIB, IVB, and VB, and rare-earth metals, which can be deposited with deposition techniques, such as plasma-enhanced chemical-vapor deposition (PECVD), radio-frequency plasma-enhanced chemical-vapor deposition (RFPECVD), expanding thermal-plasma chemical-vapor deposition (ETPCVD), reactive sputtering, electron-cyclodrawn-residence plasma-enhanced chemical-vapor deposition (ECRPECVD), inductively coupled plasma-enhanced chemical-vapor deposition (ICPECVD), sputter deposition, evaporation, atomic layer deposition (ALD), or combinations thereof.

The outer surface of the composite substrate 90 may also include a protective layer 98. The protective layer 98 generally comprises a layer/coating that is abrasion resistant and has a low coefficient of thermal expansion. The layer 98 may be implemented to prevent the substrate 90 from being scratched when handling. Further, because of the low CTE, the protective layer 98 also allows processing of the substrate 98 at high temperatures. The protective layer 98 may comprise any of those materials described above with respect to layer 96 and may be deposited by any of the deposition techniques described above with regard thereto.

Figure 12:
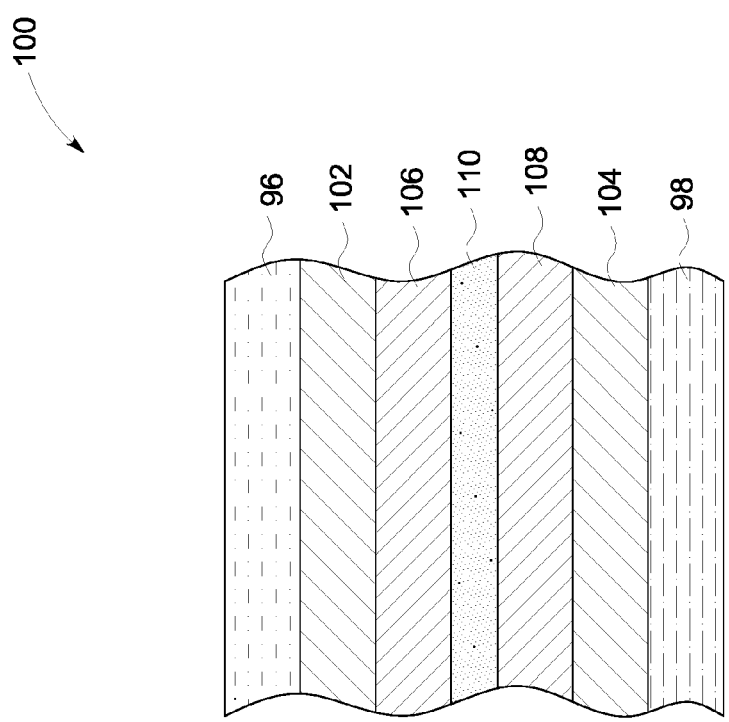
FIG. 12 is a cross sectional view of another exemplary composite substrate that may be implemented in conjunction with the present techniques.

FIG. 12 illustrates an alternate embodiment of a flexible composite substrate 100 which may be implemented in accordance with the previously described sealing techniques. The composite substrate 100 of FIG. 12 is similar to the substrate illustrated with respect to FIG. 11. The difference between the substrate 100 and the substrate 90 is the use of two layers of film 102 and 104 as opposed to one layer of film 92 (as in FIG. 11). In the illustrated embodiment, each of the two films 102 and 104 has a barrier coating (not shown) disposed or deposited on the films. Further, the two barrier coatings 106 and 108 may be coupled by employing an adhesive layer 110.

While only certain features of the invention have been illustrated and described herein, many modifications and changes will occur to those skilled in the art. It is, therefore, to be understood that the appended claims are intended to cover all such modifications and changes as fall within the true spirit of the invention.

The invention claimed is:

1. A hermetically sealed package comprising:
   a first substrate configured to receive an organic electronic device;

an organic electronic device disposed on an upper surface of the substrate; and a superstrate disposed proximate to the organic electronic device, wherein the superstrate comprises a peripheral portion adapted to wrap around edges of the package such that the peripheral portion of the superstrate is coupled to a lower surface of the substrate opposite the organic electronic device.

2. The hermetically sealed package of claim 1, comprising a metal alloy sealant layer disposed on the lower surface of the substrate such that the peripheral portion of the superstrate is hermetically sealed to the lower surface of the substrate.

3. The hermetically sealed package of claim 1, comprising an insulating adhesive layer disposed between the organic electronic device and the superstrate.

4. The hermetically sealed package of claim 1, comprising a desiccant material disposed within pockets formed by wrapping the edges of the package with the superstrate.

5. The hermetically sealed package of claim 1, comprising a primer layer disposed between the metal alloy sealant layer and the lower surface of the substrate and between the metal alloy sealant layer and the peripheral portion of the superstrate.

6. The hermetically sealed package of claim 5, wherein the primer layer comprises tin.

7. The hermetically sealed package of claim 1, wherein the first substrate comprises a plastic, a metal foil, or a glass.

8. The hermetically sealed package of claim 1, comprising a barrier coating disposed between the first substrate and the organic electronic device.

9. The hermetically sealed package of claim 1, wherein the organic electronic device comprises an organic electroluminescent device or an organic photovoltaic device.

10. The hermetically sealed package of claim 1, wherein a melting point of the metal alloy sealant is configured to be greater than an operating temperature of the organic electronic device.

11. The hermetically sealed package of claim 1, wherein the metal alloy sealant layer comprises alloys of bismuth, or tin, or lead, or indium, or cadmium, or combinations thereof.

12. The hermetically sealed package of claim 11, wherein a volume percent of bismuth ranges from about 0 to about 50%, or a volume percent of tin ranges from about 5% to about 50%, or a volume percent of lead ranges from about 0 to about 50%, or a volume percent of indium ranges from about 0 to about 55%, or a volume percent of cadmium ranges from about 0 to about 15%.

13. The hermetically sealed package of claim 1, wherein the superstrate comprises a metal foil, a glass, or a plastic.

14. A hermetically sealed package comprising:

a first substrate configured to receive an organic electronic device;

an organic electronic device disposed on an upper surface of the substrate, wherein the organic electronic device comprises an organic electroluminescent device or an organic photovoltaic device;

an insulating adhesive layer disposed above the organic electronic device;

a superstrate coupled to the insulating adhesive layer and disposed proximate to the organic electronic device, wherein the superstrate comprises a peripheral portion adapted to wrap around edges of the package such that the peripheral portion of the superstrate is coupled to a lower surface of the substrate opposite the organic electronic device; and a metal alloy sealant layer disposed on the lower surface of the substrate such that the peripheral portion of the superstrate is hermetically sealed to the lower surface of the substrate.

\* \* \* \* \*

UNITED STATES PATENT AND TRADEMARK OFFICE
CERTIFICATE OF CORRECTION

PATENT NO. : 7,816,676 B2  Page 1 of 1
APPLICATION NO. : 12/062364
DATED : October 19, 2010
INVENTOR(S) : Foust et al.

It is certified that error appears in the above-identified patent and that said Letters Patent is hereby corrected as shown below:

On the title page, item (12), under "United States Patent", in Column 1, Line 1, delete "Fourst" and insert -- Foust --, therefor.

On the title page, item (75), under "Inventors", in Column 1, Line 1, delete "Fourst," and insert -- Foust, --, therefor.

Signed and Sealed this

Seventh Day of December, 2010

David J. Kappos
*Director of the United States Patent and Trademark Office*